(12) United States Patent
Goossen (10) Patent No.: US 6,434,726 B1
(45) Date of Patent: Aug. 13, 2002

(54) SYSTEM AND METHOD OF TRANSMISSION USING COPLANAR BOND WIRES

(75) Inventor: Keith W. Goossen, Aberdeen, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/342,809

(22) Filed: Jun. 29, 1999

(51) Int. Cl.[7] .............................................. G06F 17/50
(52) U.S. Cl. ......................................................... 716/5
(58) Field of Search ........................ 333/246; 343/860; 716/12, 5, 4, 15

(56) References Cited

U.S. PATENT DOCUMENTS

| | | |
|---|---|---|
| 3,961,415 A | 6/1976 | Davis, Jr. |
| 4,686,492 A | 8/1987 | Grellmann et al. |
| 4,981,817 A | 1/1991 | Stone, Jr. |
| 5,010,642 A | 4/1991 | Takahashi et al. |
| 5,389,904 A | 2/1995 | Tao et al. |
| 5,437,095 A | 8/1995 | Nguyen et al. |
| 5,455,524 A | 10/1995 | Ikeya et al. |
| 5,459,284 A | 10/1995 | Bockelman et al. |
| 5,468,994 A | 11/1995 | Pendse |
| 5,471,010 A | 11/1995 | Bockelman et al. |
| 5,477,083 A | 12/1995 | Kawai |
| 5,499,445 A | 3/1996 | Boyle et al. |
| 5,528,074 A | 6/1996 | Goto et al. |
| 5,531,022 A | 7/1996 | Beaman et al. |
| 5,532,506 A | 7/1996 | Tserng |
| 5,536,906 A | 7/1996 | Haas, Jr. et al. |
| 5,583,468 A | 12/1996 | Kielmeyer et al. |
| 5,614,442 A | 3/1997 | Tserng |
| 5,616,539 A | 4/1997 | Hey-Shipton et al. |
| 5,683,919 A | 11/1997 | Tserng |
| 5,691,673 A | 11/1997 | Ishikawa |
| 5,696,950 A | 12/1997 | Ichinose et al. |
| 5,724,726 A | 3/1998 | Tomita et al. |
| 5,729,378 A | 3/1998 | Tanaka et al. |
| 5,736,913 A * | 4/1998 | Sanyigo ...................... 333/246 |
| 5,821,457 A | 10/1998 | Mosley et al. |
| 5,832,376 A | 11/1998 | Henderson et al. |
| 5,854,534 A | 12/1998 | Beilin et al. |
| 5,892,274 A | 4/1999 | Buschbom |
| 6,121,940 A * | 9/2000 | Skahill ........................ 343/860 |

* cited by examiner

Primary Examiner—Matthew Smith
Assistant Examiner—Thuan Do
(74) Attorney, Agent, or Firm—Morgan & Finnegan (57) ABSTRACT

During device design, wire bonds are typically considered lumped electrical parasitic elements. To minimize their effect, designs attempt to reduced their length. In the invention, wire bonds are considered as transmission lines and their spacing and configuration on the device planned accordingly. Specifically, bond wires are treated as "coplanar wires." By selecting a proper combination on wire diameter, bond wire spacing, separation of the bond wires from the substrate and the substrate dielectric constant, a desired bond wire impedance is achievable.

36 Claims, 8 Drawing Sheets

SYSTEM AND METHOD OF TRANSMISSION USING COPLANAR BOND WIRES

BACKGROUND OF THE INVENTION

1. Field of the Invention

The invention pertains to the field of electronic device fabrication and packaging and more particularly to design of bond wire configurations.

2. Background Information

Wire-bonding is a widely used electrical packaging technique for interconnecting a semiconductor device with a mounting. However, wire-bonding becomes more problematic as data rates increase (e.g., at higher frequencies) due to parasitics. Parasitics take many forms, one of which is excessive or variable impedance. A solution to control or reduce parasitic effects includes designing the device to reduce bond wire lengths, thereby reducing the bond wire inductance. Where a bond wire connection is desirable at the device edge, short bond wire lengths are possible and have utility. However, there are device applications were a bond wire is required on the device interior. Device designs and design techniques to reduce or control parasitic effects for these configurations are needed. Additionally, device designs and techniques to reduce or control parasitic effects with bond wire attachments at device edges are valuable.

SUMMARY OF THE INVENTION

In one aspect, the invention discloses an electronic device with a desired bond wire transmission line impedance. Bond wire transmission line impedance in this regard is well known, and is represented by (inductance per unit length/capacitance per unit length)$^{1/2}$. Wire bonds connect a first region, such as a microstrip connector on a mounting, with a second region, such as a connection on a semiconductor chip. The wire bonds are separated and traverse over a substrate region on the semiconductor chip. The desired bond wire impedance is achieved by adjusting or configuring the separation or distance between the bond wires (wire center-center distance) and the separation between the bond wires and the substrate (substrate-wire gap), with consideration for the bond wire diameter, and the device substrate dielectric constant. This aspect of the invention has an advantage of providing a device with bond wires that have variable center-center separation but provide a desired impedance.

In another aspect, the invention discloses an electronic device with a desired bond wire impedance. Wire bonds connect a first region, such as a microstrip connector on a mounting, with a second region, such as a connection on a semiconductor chip. The wire bonds are substantially parallel and traverse over a substrate region on the semiconductor chip at a substantially constant distance. The desired bond wire impedance is achieved by adjusting or configuring the separation or distance between the bond wires (wire center-center distance) and the separation between the bond wires and the substrate (substrate-wire gap), with consideration for the bond wire diameter, and the device substrate dielectric constant. This aspect of the invention has an advantage of providing a device using parallel bond wires uniformly separated from a device substrate to provide a desired impedance.

In another aspect, the invention discloses a design method whereby a desired impedance is achieved in at least two bond wires that connect a first and second region on the device. The bond wire diameter is determined, the device substrate dielectric constant is determined and these values are used in conjunction with the separation between the bond wires and the separation between the bond wires and the substrate to provide the desired impedance. This aspect of the invention has an advantage of providing a device design technique to provide a desired bond wire impedance by configuring packaging variables.

The foregoing specific aspects and advantages of the invention are illustrative of those which can be achieved by the present invention and are not intended to be exhaustive or limiting of the possible advantages that can be realized. Thus, the objects and advantages of this invention will be apparent from the description herein or can be learned from practicing the invention, both as embodied herein or as modified in view of any variations which may be apparent to those skilled in the art. Accordingly the present invention resides in the novel parts, constructions, arrangements, combinations and improvements herein shown and described.

BRIEF DESCRIPTION OF THE DRAWING

The foregoing features and other aspects of the invention are explained in the following description taken in conjunction with the accompanying figures wherein.

It is understood that the drawings are for illustration only and are not limiting.

DETAILED DESCRIPTION OF THE INVENTION

As described above, reduction and control of bond wire transmission line impedance is a desirable objective during device design. Bond wire transmission line impedance in this regard is well known, and is represented by (inductance per unit length/capacitance per unit length)$^{1/2}$. To accomplish this objective, the invention discloses device design with treatment of bond wires as transmission lines. In this technique, the bond wire configuration is adjusted to provide a desired impedance. According to the invention, when the bond wire configurations are designed as transmission lines, the bond wire impedance is matched to the surrounding package (e.g., the microstrip package in which the device is mounted). When so designed, parasitic effects from impedance. mismatch of the bond wires is reduced. The invention, as applied to a multiple bond wire configuration, is described below with reference to the figures.

Figure 1:
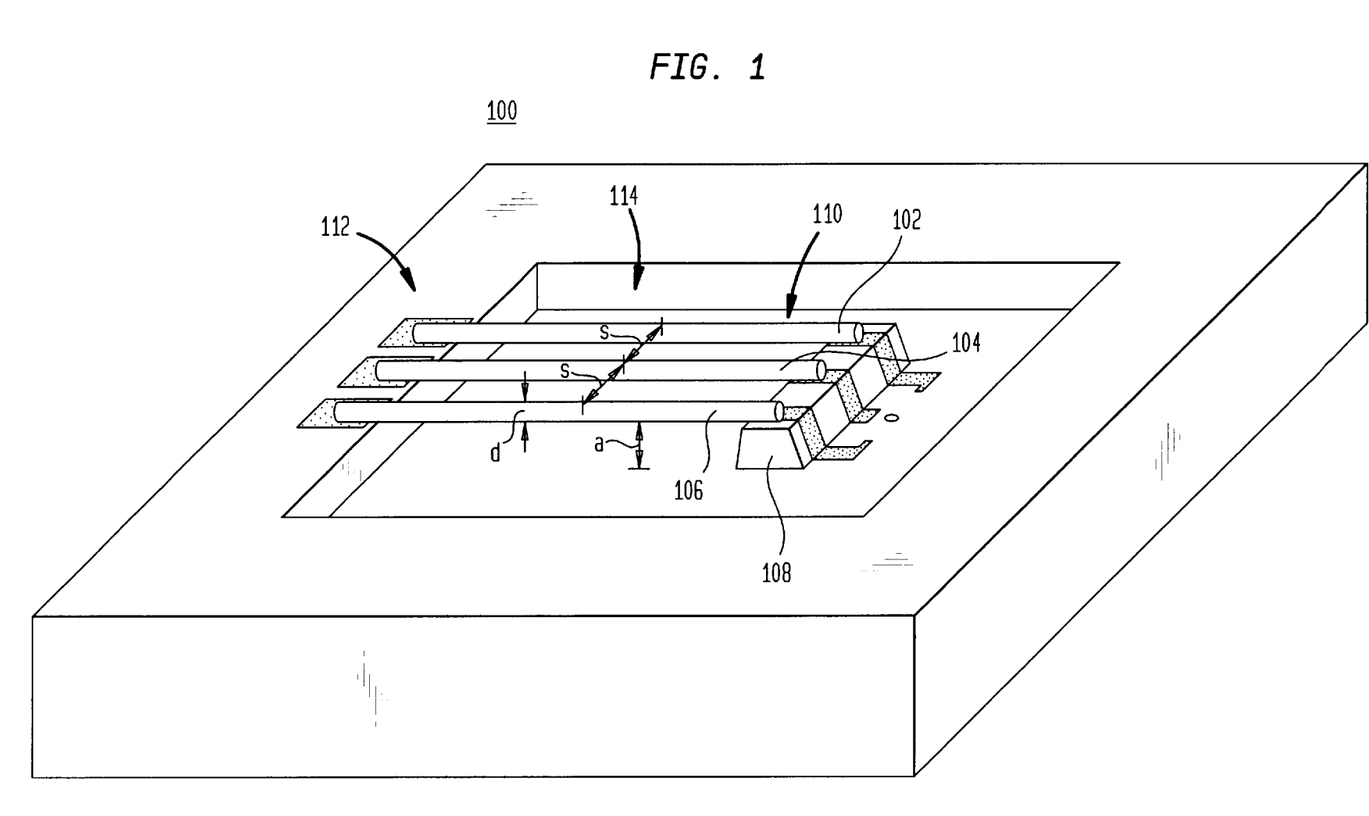
FIG. 1 illustrates a perspective view of bond wire geometry in an embodiment of the invention.

In one embodiment of the invention illustrated in FIG. 1, device 100 includes two or more bond wires 102, 104, 106 in a coplanar arrangement. The bond wires are uniformly separated (distance s, measured as the center-center separation) from each other. Standoff 108 on device substrate 110 also uniformly separates and elevates bond wires 102, 104, 106 from the device substrate (distance a, measured as the distance between the wire edge and the substrate), as the bond wires traverse from standoff 108 over device substrate 110 to microstrip package 112. As illustrated by the device in FIG. 1, microstrip package 112 has an opening 114 to hold device substrate 110. The device substrate is secured in the opening and recessed below the top surface of the microstrip package. The recess distance is the same as the standoff height, so that in going from microstrip package 112 to standoff 108, bond wires 102, 104, 106 are substantially and uniformly separated from device substrate 110. This uniform separation (a) of the bond wires from the device substrate is one major consideration in controlling bond wire impedance. The other major consideration in controlling bond wire impedance is separation of the bond wires from each other (i.e., distance (s) in FIG. 1).

Figure 2:
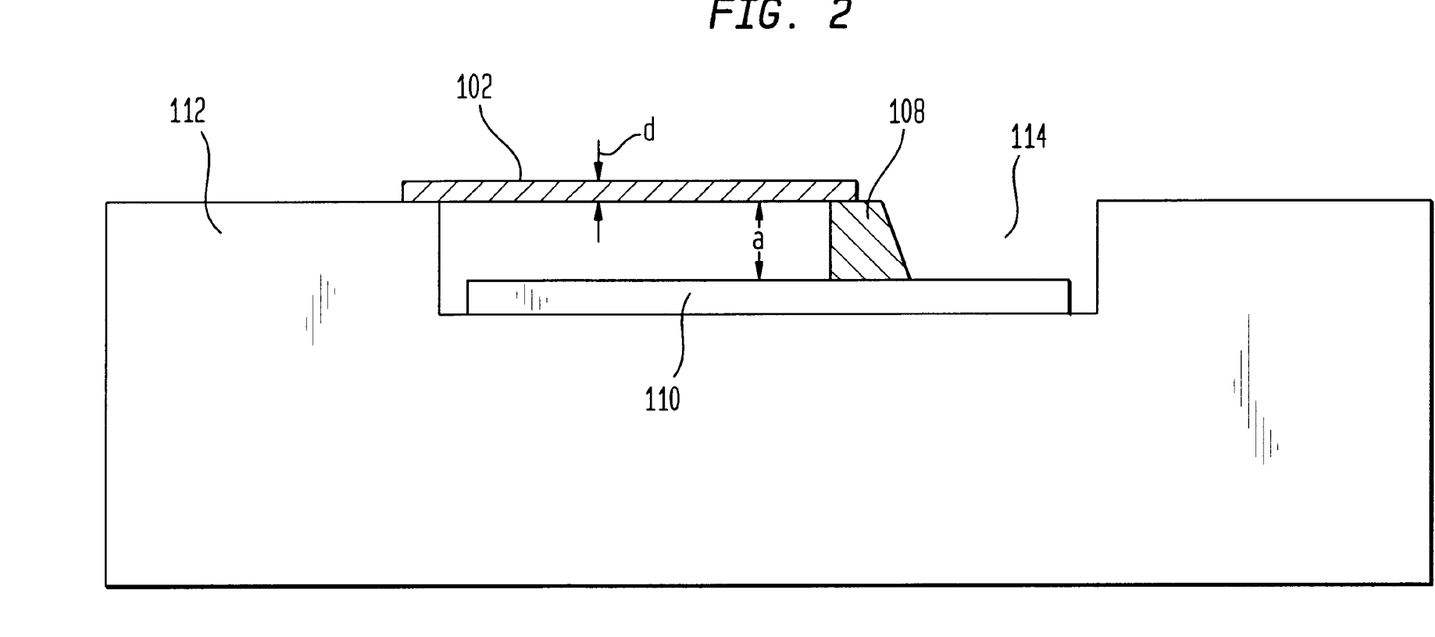
FIG. 2 illustrates a side view of bond wire geometry in an embodiment of the invention.

FIG. 2 provides an alternative view-point of the device in FIG. 1, to illustrate configuration of bond wire 102 in relationship to microstrip package 112, standoff 108, and the separation of the bond wires from device substrate 110. In FIG. 2, standoff 108 is illustrated as a significant structure. However, it is possible that a conventional or slightly thicker metal bonding pad on device substrate 110 serves as standoff 108 and provides the required separation between the bond wires and the device substrate.

Mere parallel arrangement of the bond wires with respect to each other at a uniform distance above the device substrate does not necessarily ensure that the bond wires have the desired impedance. At least three variables or factors significantly influence the resulting bond wire impedance, and the invention inter-relates these variables or factors to achieve the desired bond wire impedance in the device. During device design, the impedance of the "coplanar wire" transmission line illustrated in FIGS. 1 & 2 is analyzed as a function of these three variables. These variables include: the wire-substrate separation (a) between the bond wires (102, 104, 106) and the device substrate 110; the center-center separation (s) between the bond wires; and the dielectric constant of device substrate 110. Each variable or factor is discussed in greater detail below.

Figure 3A:
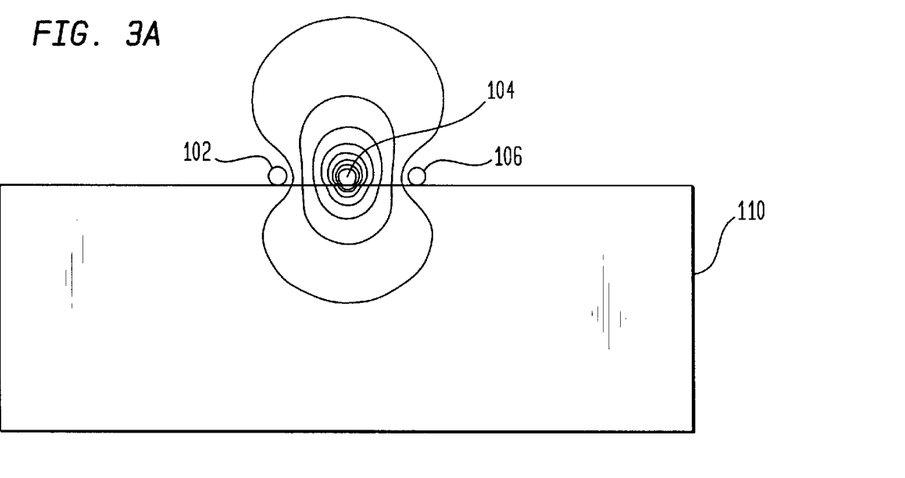
FIG. 3 illustrates a plot of equipotential lines of coplanar wire transmission lines.
Figure 3B:
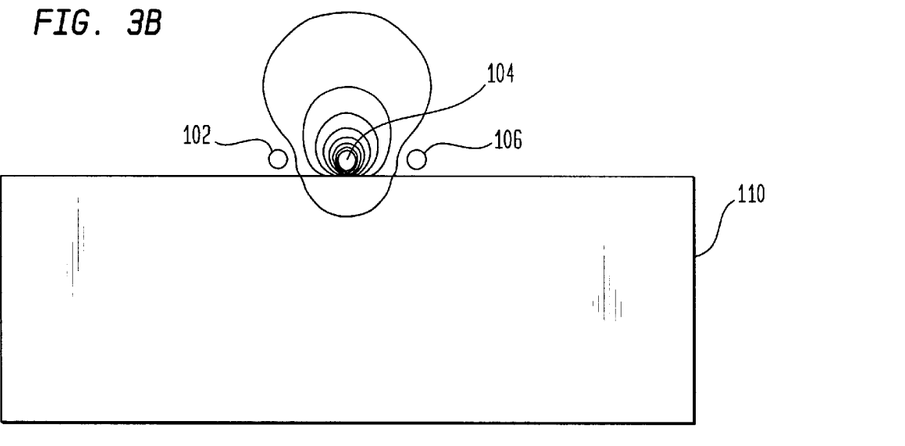
Figure 3C:
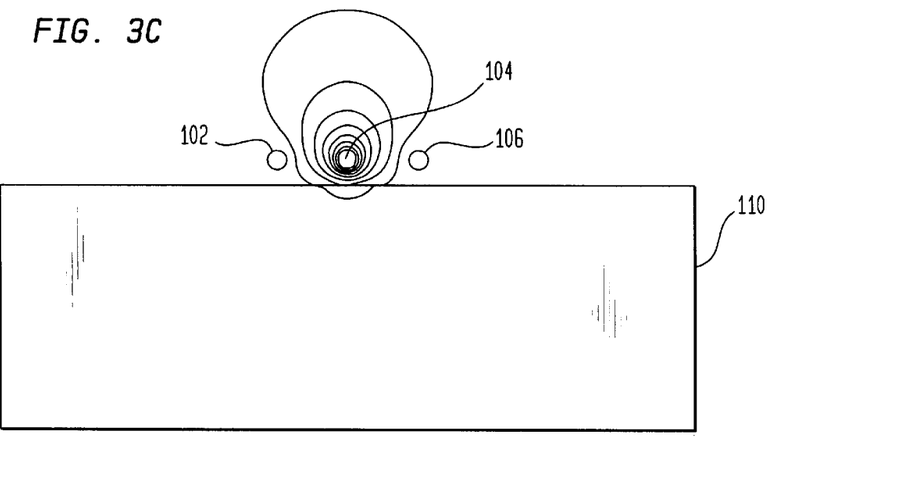
Figure 4:
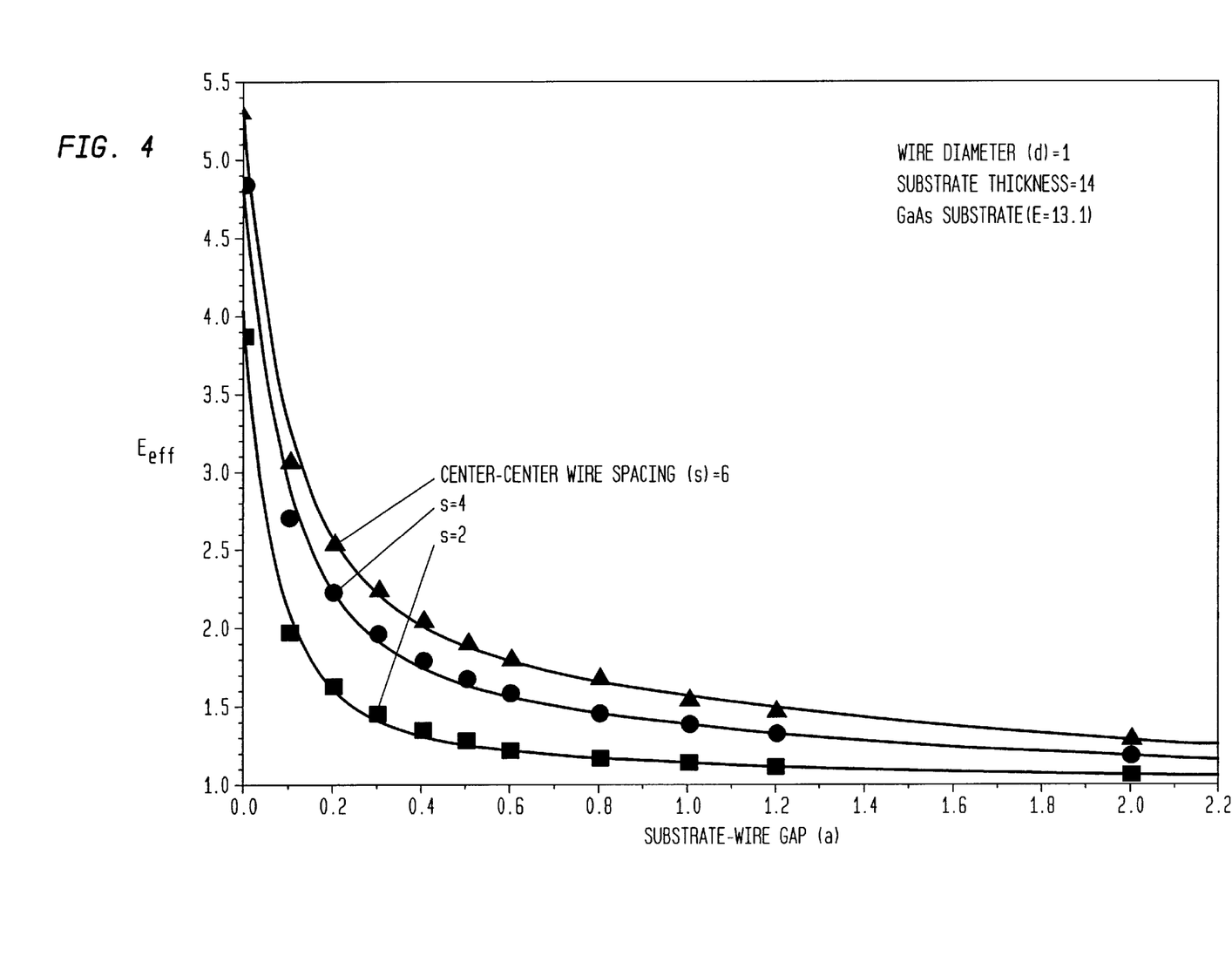
FIG. 4 illustrates an effective dielectric constant for various configurations of coplanar bond wires as transmission lines.

One of the variables, or factors affecting the bond wire impedance is distance or separation between the bond wires and the device substrate (e.g., distance (a) in FIGS. 1 & 2). An effect of changing this variable or factor is illustrated in FIG. 3, where the equipotential lines in a three wire transmission line cross section are shown for different wire-substrate configurations. In FIG. 3, device substrate 110 is modeled with a dielectric constant of about 13. In FIG. 3A, wires 102, 104, 106 (the wires at ground potential, positive potential, and ground potential respectively) are directly on the device substrate (i.e., distance a is zero). In FIG. 3B, wires 102, 104, 106 are separated from the device substrate by one half wire diameter (i.e., a=d/2), and in FIG. 3C, wires 102, 104, 106 are separated from device substrate 110 by one wire diameter (i.e., a=d). As illustrated in FIGS. 3A–3C, there is considerable crowding of the equipotential lines between substrate 110 and wires 102, 104, 106 with small separations between the wires and substrate. As a result, the effective dielectric constant ($\in_{eff}$) varies greatly with variation in wire-substrate separation. This variation in effective dielectric constant ($\in_{eff}$) is illustrated in FIG. 4 for a three wire configuration. As illustrated, for constant wire center-center separation (i.e., s is constant), when the bond wires are on or very near the device substrate (i.e., a small substrate-wire gap), the effective dielectric constant is a value between the dielectric constant of the device substrate and air (the GaAs device substrate in the illustration has a dielectric constant of 13.1 and air has a dielectric constant of about 1). When the wires are significantly separated from the device substrate (i.e., a large substrate-wire gap) the effective dielectric constant is a value that is closer to the dielectric value of air (about 1).

The effective dielectric constant, illustrated in FIG. 4 was modeled using a finite element software application available from Field Precision, PO Box 13595, Albuquerque, N. Mex. 87192. This modeling application, or any application with similar modeling capability is used in the invention to model the various design factors with various device configurations.

Another significant factor affecting bond wire impedance is center-center separation between the bond wires. This factor is independently variable with respect to the previously described wire-substrate separation. However, the resulting bond wire impedance for the device is effected by both factors, thereby providing the desired bond wire impedance. As illustrated in FIG. 4, variation in the center-center wire spacing provides variation in impedance. If the substrate-wire gap is held constant and the wire center-center spacing is varied, the impedance also varies. As the wire center-center spacing increases the impedance increases. Conversely, as the wire center-center spacing decreases (i.e., the wires approach each other) the impedance decreases. The center-center spacing (s) illustrated in FIG. 4 is a ratio of the spacing to the wire diameter. Similarly, the wire-substrate gap (a) in FIG. 4 is a ratio of the gap distance to wire diameter.

The last significant factor affecting the bond wire impedance is the impedance of the device substrate. For most devices this factor is a given and is not adjustable. However, it is possible to interpose other materials in the gap between the bond wires and the device substrate, thereby effectively changing the impedance of the device substrate.

Having described the significant factors affecting the bond wire impedance, a design technique is described. During design of a device with control of the bond wire impedance as one of the design considerations, the wires are considered to have plus and minus voltages on them, with a ground plane beneath the device substrate. The effective dielectric constant, $\in_{eff}$, is determined for a proposed bond wire configuration by taking the ratio of the capacitance's of the transmission line cross section with the device substrate dielectric constant at the actual value and also at a dielectric constant of one (i.e., unity). The characteristic impedance is determined using the effective dielectric constant ($\in_{eff}$) and the impedance for unity device substrate dielectric constant ($Z_0'$). The relationship is provided by:

$$Z_0 = Z_0'/(\in_{eff})^{1/2}$$

Figure 5:
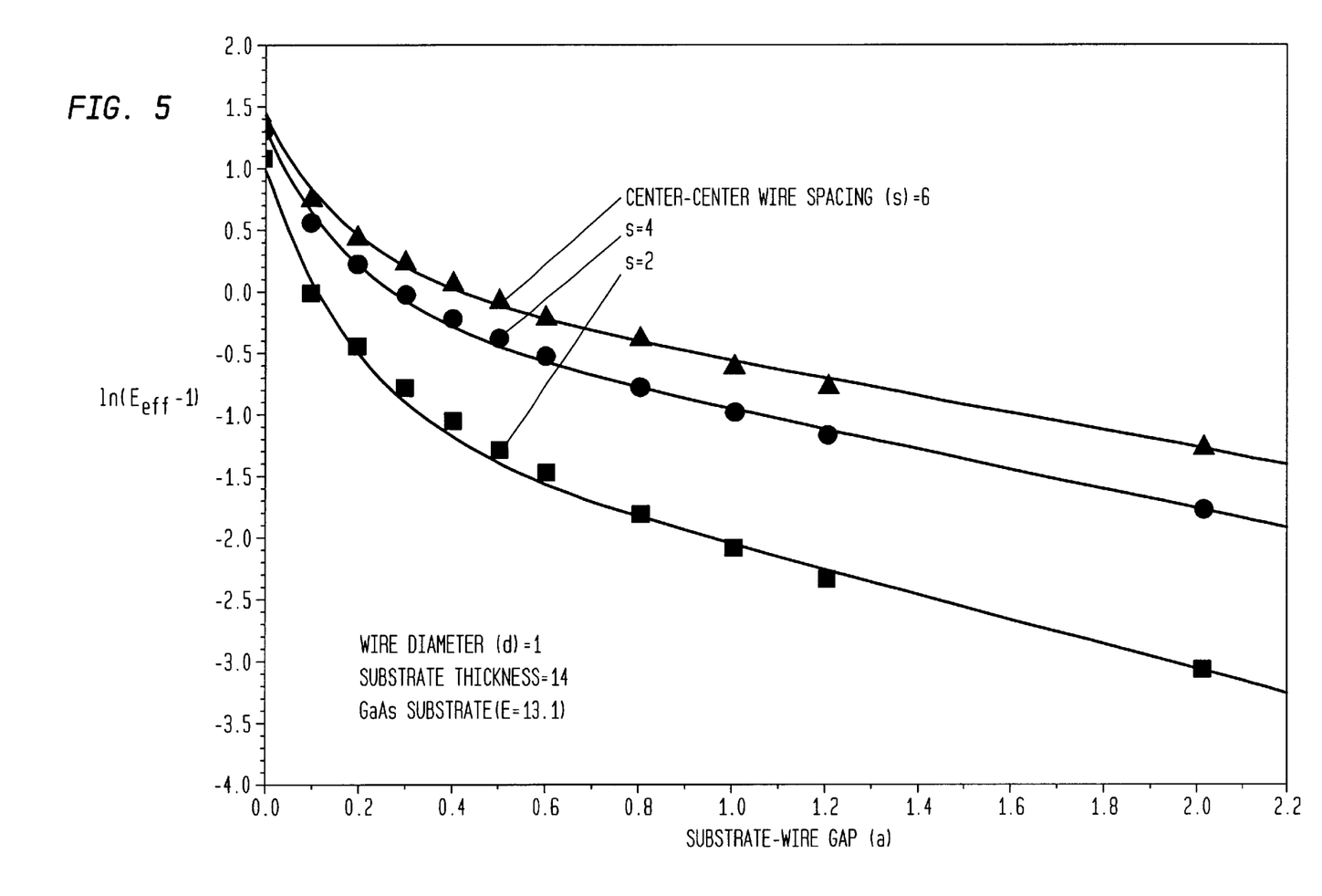
FIG. 5 illustrates a plot of logarithm of effective dielectric constant minus one for various configurations of coplanar bond wires as transmission lines.

The results for the example device model illustrated in FIG. 4 are also illustrated in FIG. 5. FIG. 5, plotting the natural logarithm of ($\in_{eff}$-1), is not required during device design. However, the figure does help to illustrates the rapid change in dielectric constant as the substrate-wire gap increases from zero. For (a)>0.5 (i.e., the ratio between gap distance and wire diameter is greater than 0.5), the curves generally follow an exponential curve. However, for (a)<0.5 (i.e., the ratio between gap distance and wire diameter is less than 0.5), the change is super-exponential. Using modeled data, a curve fit is provided by:

$$\ln(\epsilon_{\textit{eff}}-1)=c_0-c_1 a+c_2\exp(-5a).$$

The different curve fit parameters for different center-center wire separation values (s) are listed below in Table 1. The curve fit parameters in Table 1 were generated with a particular substrate thickness (e.g., substrate thickness is 14 times the wire diameter). However, the resulting curves and curve fit parameters are not highly dependent on substrate thickness, and the above-described modeling applications can accommodate different device substrate thickness.

TABLE 1

| Wire spacing(s) | $c_0$ | $c_1$ | $c_2$ | $Z_0'$ |
|---|---|---|---|---|
| 2 | −1.1 | 1.0 | 2.1 | 92 ohms |
| 4 | −0.2 | 0.8 | 1.5 | 149 ohms |
| 6 | −0.1 | 0.7 | 1.3 | 175 ohms |

The table provides curve fit parameters and characteristic impedance for unity device substrate dielectric constant, for different center-to-center wire spacings, for unity wire diameter (note results are independent of the overall scale), for a GaAs substrate with a dielectric constant of 13.1 and thickness of 14. The results are fairly independent of substrate thickness.

Figure 6:
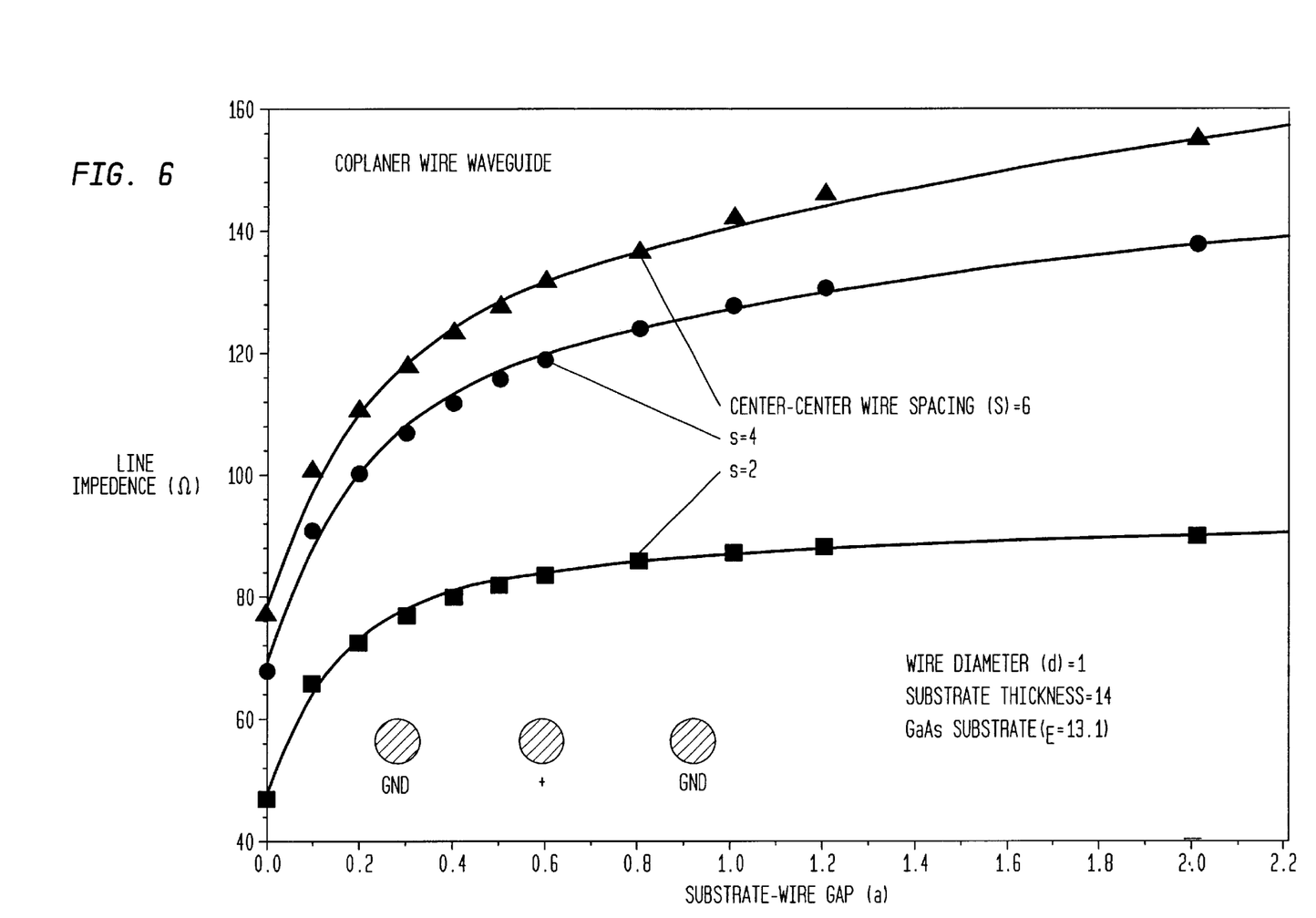
FIG. 6 illustrates a characteristic impedance for various configurations of coplanar bond wires as transmission lines.

FIG. 6 illustrates the characteristic impedance of the bond wires, when modeled as transmission lines. The impedance for a unity substrate dielectric constant (that which the curves asymptotically go to for infinite wire-substrate spacing) may be calculated. As illustrated in FIG. 6, with a GaAs device substrate, it is possible to design a three bond wire configuration with a desired impedance at almost any point between about 50 and 150 ohms by selecting an appropriate combination of substrate-wire gap, and center-center wire separation.

Figure 7:
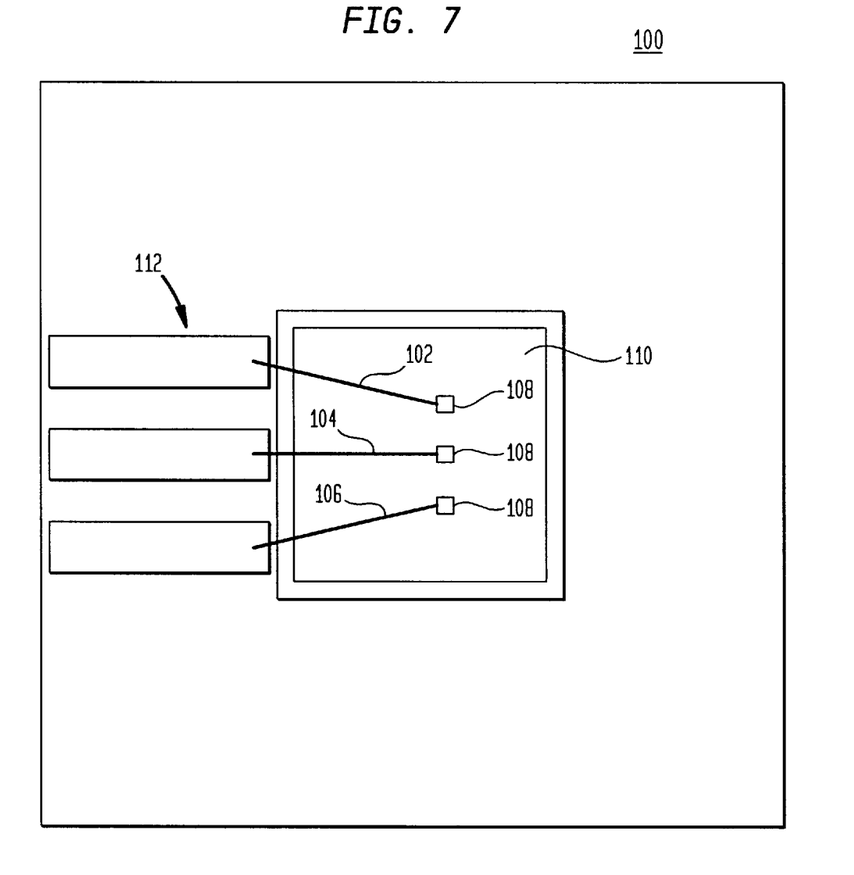
FIG. 7 illustrates a top view of bond wire geometry in an embodiment of the invention.
Figure 8:
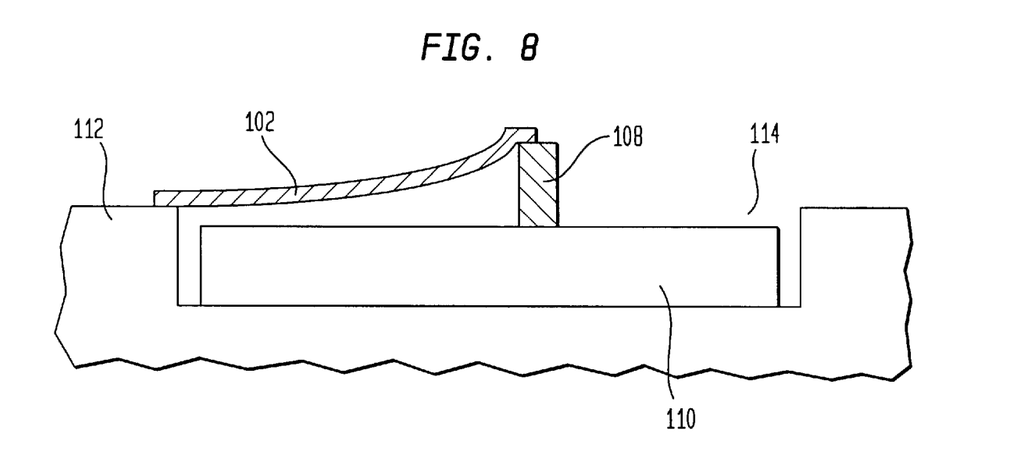
FIG. 8 illustrates a side view of bond wire geometry in an embodiment of the invention.

The preceding example has used bond wires that are substantially parallel to each other and at a substantially constant separation from the device substrate. However, there are device designs where those assumptions are not appropriate. As an example, referring to FIG. 7, the device design may require a variable or changing bond wire center-center distance. In this example, the distance between bond wires 102, 104, 106 changes linearly, with a greater distance at the connection to the microstrip and a lesser distance at the connection to the device. In this configuration with uniform separation between the bond wire and the device substrate, the bond wire impedance would vary along the bond wire length. Accordingly, if a uniform bond wire impedance is desired there must be some offsetting factor. One example of an offsetting factor is illustrated in FIG. 8. As the center-center distance between bond wires decreases, the wire-substrate gap increases. The combination of these two varying distances produces a uniform bond wire impedance along the bond wire.

Figure 9:
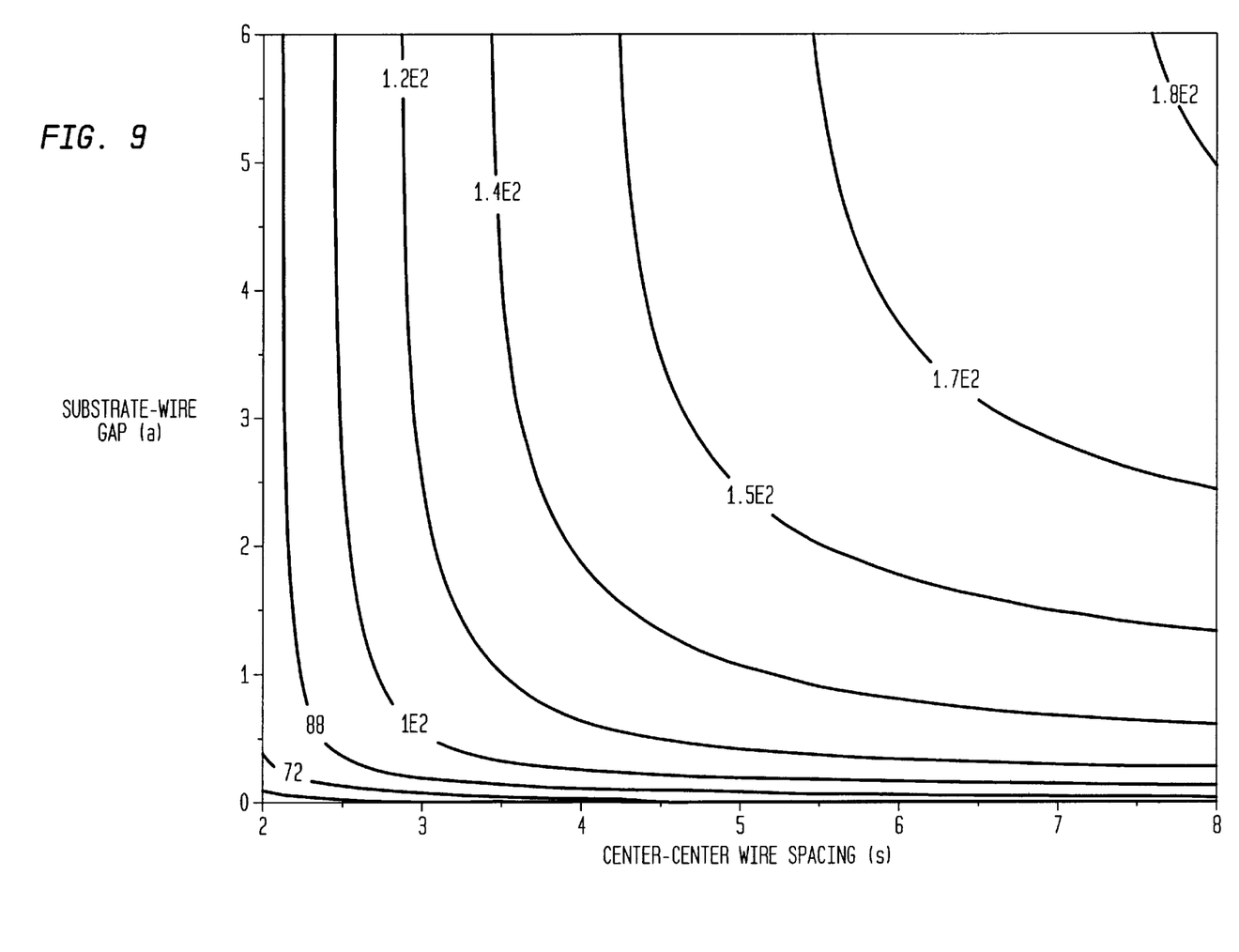
FIG. 9 illustrates a plot of the relationship between substrate-wire gap; center-center wire spacing and characteristic impedance for various configurations of coplanar bond wires as transmission lines.

The relationship between bond wire center-center distance and substrate-wire distance to provide a desired impedance with one particular device substrate is illustrated in FIG. 9. Using FIG. 9, a desired bond wire impedance can be selected. With this desired impedance there are many combinations of corresponding center-center spacing and substrate-wire gap that will provide that desired impedance. The designer need only configure the bond wires with respect to each other and the device substrate according to the plot of constant impedance in order to achieve the desired bond wire impedance.

It is also possible to model provide curve fit parameters for $$Z_0 = Z_0'/(\epsilon_{\textit{eff}})^{1/2};$$

$$\ln(\epsilon_{\textit{eff}}-1)=c_0-c_1 a+c_2\exp(-5a);$$

$$Z_0'=140(s-1)/[1+0.6(s-1)];$$

$$c_0=1.1-[2.2/(s-1)^{1/2}];$$

$$c_1=0.3\times[0.7/(s-1)^{1/3}];$$

and $$c_2=0.7\times[1.4/(s-1)^{1/2}],$$

where:
($Z_0$) is the desired impedance;
(s) is a ratio of the center-center separation between bond wires and bond wire diameter; and
(a) is a ratio of the distance between the bond wire and the third region.

In this manner, a characteristic impedance of the bond wire configuration can be directly computed as a function of center-center spacing (s) and wire-substrate gap (a). The center-center spacing (s) is a ratio of the wire center-center spacing to the wire diameter (center-center spacing measured from the respective wire centers). Similarly the wire-substrate gap (a) is a ratio of the wire-substrate distance to wire diameter (wire-substrate distance measured from the wire edge to the substrate).

In conclusion, a device design technique is provided to achieve a desired bond wire impedance. With straight and parallel bond wires the coplanar wires are maintained at a constant height above the device substrate and so function as a matched transmission line. The characteristic impedance of such a "coplanar wire" transmission line has been determined as a function of its wire spacing and height above the substrate. The large sensitivity to height above the substrate is shown, thus requiring great precision in maintaining that height in a practical arrangement. For bond wire configurations with non-uniform spacing, techniques to provide the desired bond wire impedance are also provided.

Although illustrative embodiments have been described herein in detail, it should be noted and will be appreciated by those skilled in the art that numerous variations may be made within the scope of this invention without departing from the principle of this invention and without sacrificing its chief advantages. Such variations include embedding the bond wires in a dielectric matrix. The matrix may have a dielectric constant that is different from the device substrate or air and provides multiple advantages. One advantage may be maintaining the desired center-center separation between the bond wires. Another advantage may be maintaining the desired wire-substrate separation. It is also possible that the dielectric constant of the matrix itself is used as a design parameter to provide the desired wire bond impedance.

Unless otherwise specifically stated, the terms and expressions have been used herein as terms of description and not terms of limitation. There is no intention to use the terms or expressions to exclude any equivalents of features shown and described or portions thereof and this invention should be defined in accordance with the claims that follow.

I claim:

1. An electronic device with a desired bond wire impedance comprising:
   a first region of the device;
   a second region of the device;
   a third region of the device; and a microstrip module,
   at least two bond wires separated from the third region and providing connections between the first and second regions, where a separation between bond wires and a separation between the bond wires and the third region are selected; wherein said bond wires of a specified diameter; a substrate positioned in a recessed area (third region) of said microstrip module; a standoff; wherein said bond wires spaced a calculated distance apart from each other as well as spaced a calculated distance apart from said substrate;
   said bond wires connected on one end to an edge of the microstrip module and on the other end to said standoff to provide a substantially constant desired impedance along the bond wires.

2. The device according to claim 1, wherein the bond wire diameter, a substrate dielectric constant in the third region and a substrate thickness contribute to the desired impedance.

3. The device according to claim 1, wherein the third region substrate resides in a recessed area of the device.

4. The device according to claim 1, wherein the first region further comprises a raised area.

5. The device according to claim 1, wherein the second region further comprises a raised area.

6. The device according to claim 1, wherein the first region further comprises a microstrip.

7. The device according to claim 1, wherein the distance between the bond wires and the third region is greater than about one third the bond wire diameter.

8. A device according to claim 1, wherein a center-center distance between the bond wires is generally greater than about twice the bond wire diameter.

9. A device according to claim 1, wherein the bond wires are substantially the same diameters.

10. A device according to claim 1, wherein the separation between bond wires varies along the bond wire length.

11. The device according to claim 1, wherein the separation between bond wires and the third region varies along the bond wire length.

12. The device according to claim 1, further comprising a dielectric substantially disposed between the bond wires and the third region.

13. A device according to claim 1, wherein the bond wires are substantially disposed within a dielectric.

14. The device according to claim 1, wherein the substrate within the third region is substantially made of gallium arsenide (GaAs) and the separation between the bond wires generally satisfies the equations:

$$Z_0 = Z_0'/(\epsilon_{eff})^{1/2};$$

$$1n(\epsilon_{eff}-1) = c_0 - c_1 a = c_2 \exp(-5a);$$

$$Z_0' = 140(s-1)/[1 \times 0.6(s-1)];$$

$$c_0 = 1.1 - [2.2/(s-1)^{1/2}];$$

$$c_1 = 0.3 + [0.7/(s-1)^{1/3}];$$

and $$c_2 = 0.7 + [1.4/(s-1)^{1/2}],$$

where:
   ($Z_0$) is the desired impedance;
   (s) is a ratio of the center-center separation between bond wires and bond wire diameter; and
   (a) is a ratio of the distance between the bond wire and the third region.

15. An electronic device with a desired bond wire impedance comprising:
   a first region of the device;
   a second region of the device; and a microstrip module,
   at least two bond wires providing connections between the first and second regions, where the bond wires are substantially parallel to each other and each bond wire is at a substantially constant distance from a third region of the device; wherein said bond wires of a specified diameter; a substrate positioned in a recessed area (third region) of said microstrip module; a standoff; wherein said bond wires spaced a calculated distance apart from each other as well as spaced a calculated distance from said substrate;
   said bond wires connected on one end to an edge of the microstrip module and on the other end to said standoff;
   wherein the bond wires are substantially parallel to each other and each bond wire is at a substantially constant distance from the third region of the device.

16. The device according to claim 15, wherein the bond wire diameter, a substrate dielectric constant in the third region and a substrate thickness contribute to the desired impedance.

17. The device according to claim 15, wherein the third region substrate resides in a recessed area of the device.

18. The device according to claim 15, wherein the first region further comprises a raised area of the device.

19. The device according to claim 15, wherein the second region further comprises a raised area of the device.

20. The device according to claim 15, wherein the first region further comprises a microstrip.

21. The device according to claim 15, wherein the constant distance between the bond wires and the third region is greater than about one third the bond wire diameter.

22. A device according to claim 15, wherein the substantially parallel distance between the bond wires is greater than about twice the bond wire diameter.

23. A device according to claim 15, wherein the bond wires are substantially the same diameters.

24. The device according to claim 15, further comprising a dielectric substantially disposed between the bond wires and the third region.

25. A device according to claim 15, wherein the bond wires are substantially disposed within a dielectric.

26. A device according to claim 15, wherein the third region comprises a substrate substantially made of gallium arsenide (GaAs) and the separation between the bond wires and the separation between the bond wires generally satisfies the equations:

$$Z_0 = Z_0'/(\epsilon_{eff})^{1/2};$$

$$1n(\epsilon_{eff}-1) = c_0 - c_1 a + c_2 \exp(-5a);$$

$$Z_0' = 140(s-1)/[1+0.6(s-1)];$$

$c_0=1.1-[2.2/(s-1)^{1/2}]$;

$c_1=0.3+[0.7/(s-1)^{1/3}]$;

and $c_2=0.7+[1.4/(s-1)^{1/2}]$, where:
- ($Z_0$) is the desired impedance;
- (s) is a ratio of the center-center separation between bond wires and bond wire diameter; and
- (a) is a ratio of the distance between the bond wire and the third region.

27. A method to obtain a desired impedance in a electronic device comprising:
   determining a desired impedance of at least two bond wires, the bond wires traversing a third region and connecting a first region of the device to a second region of the device; and
   positioning the bond wires a calculated spacing apart from each other as well as a calculated distance from the substrate to substantially obtain the desired impedance.

28. A method according to claim 27, wherein a separation between bond wires varies along the bond wire length.

29. The method according to claim 27, wherein a separation between the bond wires and the third region varies along the bond wire length.

30. The method according to claim 27, further comprising:
   determining a diameter of the bond wires; and
   determining an impedance of a substrate in a third region of the device.

31. The method according to claim 27, wherein the desired impedance is generally determined by the equation:

$Z_0=Z_0'/(\in_{\mathit{eff}})^{1/2}$;

$1n(\in_{\mathit{eff}}-1)=c_0-c_1a+c_2\exp(-5a)$;

$Z_0'=140(s-1)/[1+0.6(s-1)]$;

$c_0=1.1-[2.2/(s-1)^{1/2}]$;

$c_1=0.3+[0.7/(s-1)^{1/3}]$;

and $c_2=0.7+[1.4/(s-1)^{1/2}]$, where:
- ($Z_0$) is the desired impedance;
- (s) is a ratio of the center-center separation between bond wires and bond wire diameter; and
- (a) is a ratio of the distance between the bond wire and the third region.

32. A method to package a device comprising:
   attaching at least two bond wires at a first connection region of the device; and
   attaching the bond wires at a second connection region of the device, where bond wire is positioned a calculated spacing apart from each other as well as a calculated distance from the substrate in order to provide a substantially constant desired impedance along the bond wires.

33. The method according to claim 32, wherein wire position comprises:
   a separation between the bond wires; and
   a separation between the bond wires and the third region.

34. A method according to claim 32, further comprising varying a separation between bond wires along the bond wire length.

35. A method according to claim 32, further comprising varying a separation between bond wires and the substrate along the bond wire length.

36. The method according to claim 32, further comprising considering the bond wire diameter and a substrate dielectric constant in the third region.

* * * * *